(12) United States Patent
You et al.

(10) Patent No.: US 9,005,456 B2
(45) Date of Patent: Apr. 14, 2015

(54) METHOD FOR MANUFACTURING PRINTED CIRCUIT BOARD

(71) Applicant: Samsung Electro-Mechanics Co., Ltd., Suwon (KR)

(72) Inventors: Kwang Sun You, Suwon (KR); Seung Ryeol Lee, Suwon (KR); Sang Hoon Park, Suwon (KR); Kyung Jin Heo, Suwon (KR); Jae Ho Shin, Suwon (KR); Joong Hyuk Jung, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 14/070,291

(22) Filed: Nov. 1, 2013

(65) Prior Publication Data
US 2014/0124474 A1    May 8, 2014

(30) Foreign Application Priority Data

Nov. 2, 2012  (KR) .......................... 10-2012-0123420

(51) Int. Cl.
*H01B 13/00* (2006.01)
*H05K 3/00* (2006.01)

(52) U.S. Cl.
CPC ..................................... *H05K 3/007* (2013.01)

(58) Field of Classification Search
None
See application file for complete search history.

(56) References Cited

U.S. PATENT DOCUMENTS

| | | | | |
|---|---|---|---|---|
| 4,912,020 | A * | 3/1990 | King et al. | 430/311 |
| 2006/0191709 | A1* | 8/2006 | Kim et al. | 174/255 |
| 2008/0066954 | A1* | 3/2008 | Jeon et al. | 174/261 |
| 2010/0126765 | A1* | 5/2010 | Kim et al. | 174/262 |
| 2010/0270067 | A1* | 10/2010 | Choi et al. | 174/267 |
| 2012/0266463 | A1* | 10/2012 | Lee et al. | 29/846 |
| 2012/0285924 | A1* | 11/2012 | Lee et al. | 216/13 |

* cited by examiner

*Primary Examiner* — Binh X Tran
*Assistant Examiner* — David Cathey, Jr.
(74) *Attorney, Agent, or Firm* — Ladas & Parry, LLP

(57) ABSTRACT

Disclosed herein is a method for manufacturing a printed circuit board, wherein a protective film for stripping and a metal layer closely adhered to the protective film for stripping are formed on an inner layer pad to protect the inner layer pad at the time of laser processing related to cavity processing and applying an etchant, thereby making it possible to improve reliability of a product.

16 Claims, 5 Drawing Sheets

METHOD FOR MANUFACTURING PRINTED CIRCUIT BOARD

CROSS REFERENCE TO RELATED APPLICATION

This application claims the benefit of Korean Patent Application No. 10-2012-0123420, filed on Nov. 2, 2012, entitled "Method for Manufacturing of Printed Circuit Board", which is hereby incorporated by reference in its entirety into this application.

BACKGROUND OF THE INVENTION

1. Technical Field

The present invention relates to a method for manufacturing a printed circuit board.

2. Description of the Related Art

Currently, as various designs of a printed circuit board has been required due to industrial development, a cavity processing method through laser processing in a process of manufacturing the printed circuit board, including Patent Document 1, has been variously applied.

In connection with this, at the time of cavity processing in the process of manufacturing the printed circuit board, due to over-processing that an etching process is performed up to a region other than a region in which the etching process should be performed when the etching process is performed according to a design of a copper layer and penetration of an etchant into a crack generated due to the over-processing, a problem that a printed circuit board satisfying the demand of an operator is not manufactured has been often generated.

Meanwhile, as the printed circuit board has been applied to various products, clients have demanded various types of printed circuit boards. Therefore, a case in which an inner layer pad of the printed circuit board should be opened is generated. However, due to the above-mentioned problems, the inner layer pad is over-etched at the time of being opened, such that reliability of the inner layer pad is deteriorated.

PRIOR ART DOCUMENT

Patent Document (Patent Document 1) US 2006-0191709 A

SUMMARY OF THE INVENTION

The present invention has been made in an effort to provide a method for manufacturing a printed circuit board capable of improving reliability of an inner layer pad by stably performing cavity processing of the printed circuit board.

According to a preferred embodiment of the present invention, there is provided a method for manufacturing a printed circuit board, the method including: preparing a base substrate having a circuit layer formed on one surface thereof or the other surface thereof, the circuit layer including an inner layer pad and a circuit pattern; forming an insulating layer for stripping on an outer surface of the inner layer pad in the circuit layer; forming a first insulating layer on the base substrate as well as the insulating layer for stripping and the circuit layer, the first insulating layer having an open part corresponding to the insulating layer for stripping; forming a copper clad laminate (CCL) layer on the first insulating layer so that a first metal layer for a stopper contacts an upper surface of the insulating layer for stripping exposed through the open part; performing cavity processing so that an edge region in an upper surface of the first metal layer is exposed by performing laser processing on the CCL layer; removing the exposed first metal layer in a thickness direction; removing the insulating layer for stripping exposed by removing the first metal layer in the thickness direction; separating the first metal layer contacting the insulating layer for stripping and the insulating layer for stripping from each other; and removing the insulating layer for stripping.

A diameter of the first metal layer formed to contact the upper surface of the insulating layer for stripping may be formed to be larger than that of the insulating layer for stripping, in a length direction of the substrate.

In the forming of the first insulating layer, the first insulating layer may be made of a no-flow prepreg material.

In the forming of the first insulating layer, the first insulating layer may be in a cured state.

The method may further include, after the forming of the CCL layer and before the performing of the cavity processing, forming a second insulating layer on the CCL layer and forming a second metal layer on the second insulating layer.

The method may further include, after the forming of the second metal layer, patterning the second metal layer.

In the performing of the cavity processing, the cavity processing may be performed on the second metal layer, the second insulating layer, and the CCL layer.

In the forming of the second insulating layer, the second insulating layer may be made of a prepreg material.

In the removing of the insulating layer for stripping in the thickness direction, the insulating layer for stripping may be removed using a stripping solution of sodium hydroxide (NaOH) or potassium hydroxide (KOH).

According to another preferred embodiment of the present invention, there is provided a method for manufacturing a printed circuit board, the method including: preparing a base substrate having a circuit layer formed on one surface thereof or the other surface thereof, the circuit layer including an inner layer pad and a circuit pattern; forming an insulating layer for stripping on an outer surface of the inner layer pad in the circuit layer; forming a first insulating layer on the base substrate as well as the insulating layer for stripping and the circuit layer, the first insulating layer having an open part corresponding to the insulating layer for stripping; forming a CCL layer on the first insulating layer so that a first metal layer for a stopper formed on the CCL layer contacts an upper surface of the insulating layer for stripping exposed through the open part; forming a second insulating layer on the CCL layer; forming a second metal layer on the second insulating layer; performing cavity processing so that an edge region in an upper surface of the first metal layer is exposed by performing laser processing on the CCL layer, the second insulating layer, and the second metal layer; removing the exposed first metal layer in a thickness direction; removing the insulating layer for stripping exposed by removing the first metal layer in the thickness direction; separating the first metal layer contacting the insulating layer for stripping and the insulating layer for stripping from each other; and removing the insulating layer for stripping.

A diameter of the first metal layer formed to contact the upper surface of the insulating layer for stripping may be formed to be larger than that of the insulating layer for stripping, in a length direction of the substrate.

In the forming of the first insulating layer, the first insulating layer may be made of a no-flow prepreg material.

In the forming of the first insulating layer, the first insulating layer may be in a cured state.

The method may further include, after the forming of the second metal layer, patterning the second metal layer.

In the forming of the second insulating layer, the second insulating layer may be made of a prepreg material.

In the removing of the insulating layer for stripping in the thickness direction, the insulating layer for stripping may be removed using a stripping solution of sodium hydroxide (NaOH) or potassium hydroxide (KOH).

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
FIGS. 1 to 10 are cross-sectional views sequentially showing a method for manufacturing a printed circuit board according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Method for Manufacturing Printed Circuit Board

FIGS. 1 to 10 are cross-sectional views sequentially showing a method for manufacturing a printed circuit board according to a preferred embodiment of the present invention.

As shown in FIG. 1, a base substrate 110 having a circuit layer 120 formed on one surface thereof or the other surface thereof may be provided, wherein the circuit layer includes an inner layer pad and a circuit pattern may be prepared.

Here, the base substrate 110 may be a general insulating layer used as a core substrate in a printed circuit board field or a printed circuit board 100 having a circuit formed on the insulating layer and including one layer or more connection pad.

Figure 2:
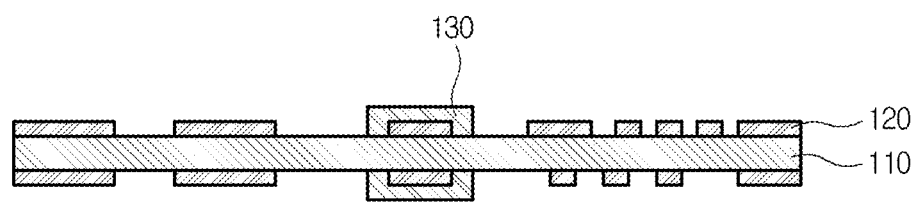

As the insulating layer, a resin insulating layer may be used. As a material of the resin insulating layer, a thermo-setting resin such as an epoxy resin, a thermo-plastic resin such as a polyimide resin, a resin having a reinforcement material such as a glass fiber or an inorganic filler impregnated in the thermo-setting resin and the thermo-plastic resin, for example, a prepreg may be used. In addition, a thermo-setting resin, a photo-curable resin, and the like, may be used However, the material of the resin insulating layer is not specifically limited thereto. Then, as shown in FIG. 2, an insulating layer 130 for stripping may be formed on an outer surface of the inner layer pad in the circuit layer.

Here, the insulating layer 130 for stripping may be made of any material capable of being used as an etching resist and have a form in which it is easily removed, such as an ink form or a tape form.

The insulating layer 130 for stripping serves to protect the inner layer pad when a laser process and a metal layer etching process are performed, in connection with cavity processing, in a subsequent process of exposing the inner layer pad.

Figure 3:
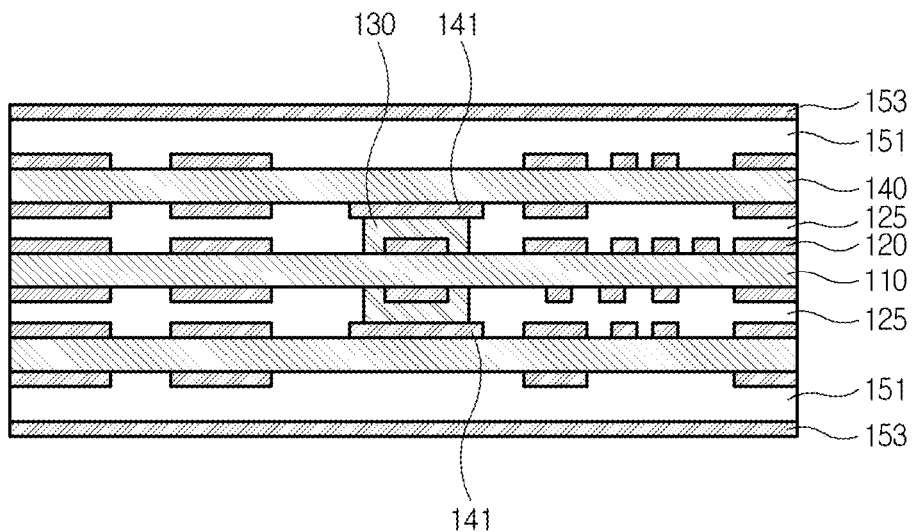

Next, as shown in FIG. 3, a first insulating layer 125 having an open part (not shown) corresponding to the insulating layer 130 for stripping may be formed on the base substrate 110 as well as the insulating layer 130 for stripping and the circuit layer 120.

The first insulating layer 125 may be in a cured state.

More specifically, the first insulating layer 125 may be made of a no-flow prepreg material.

Here, the no-flow prepreg is defined as a prepreg in which a flow is not generated in a situation in which heat is applied thereto unlike a general prepreg.

That is, the first insulating layer 125, which is made of the no-flow prepreg material that has a region punched at the same size as that of the insulating layer 130 for stripping and is in the cured state, is coupled to the insulating layer 130 for stripping in a fitting scheme in the state in which it is punched.

Here, the term 'same' does not means accurately the same thickness in a mathematical meaning, but means substantially the same thickness in consideration of a design error, a manufacturing error, a measuring error, or the like.

Next, as shown in FIG. 3, a copper clad laminate (CCL) layer 140 may be formed on the first insulating layer 125 so that a first metal layer 141 for a stopper formed on the CCL layer 140 contacts an upper surface of the insulating layer 130 for stripping exposed through the open part.

Here, a diameter of the first metal layer 141 formed to contact the upper surface of the insulating layer 130 for stripping may be formed to be larger than that of the insulating layer 130 for stripping, in a length direction of the substrate.

The reason why the diameter of the first metal layer 141 is formed to be larger than that of the insulating layer 130 for stripping is to provide against an alignment defect that may be generated in a process of forming the CCL layer 140 on the upper surface of the insulating layer 130 for stripping in the process of manufacturing the printed circuit board. In this case, reliability of alignment may be improved.

Figure 7:
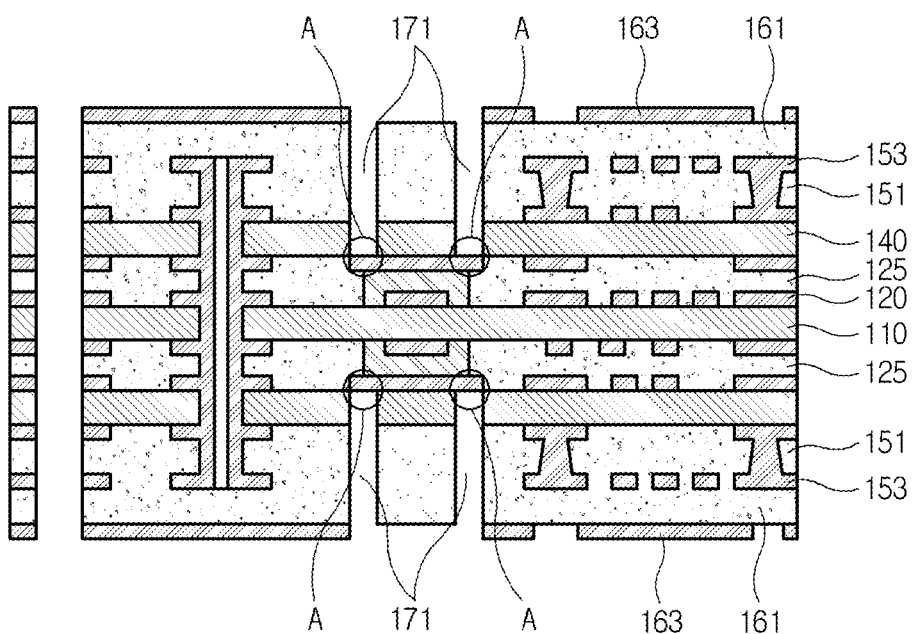

Then, as shown in FIG. 7, cavity 171 processing may be performed so that an edge region A in an upper surface of the first metal layer 141 is exposed by performing laser processing on the CCL layer 140.

Figure 8:
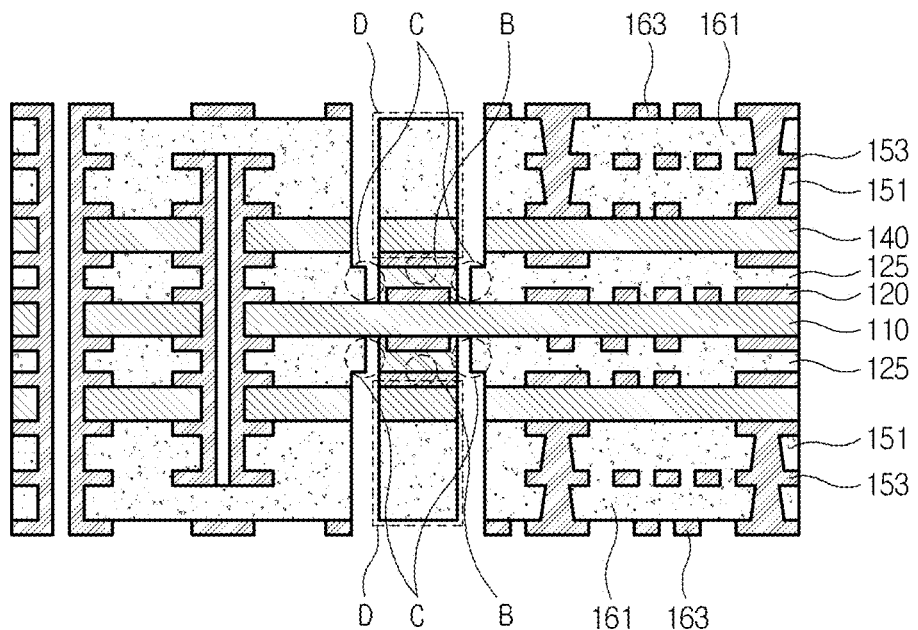

Next, as shown in FIG. 8, the exposed first metal layer 141 may be removed in a thickness direction. Here, the thickness direction is defined based on a thickness direction of the substrate.

Next, as shown in FIG. 8, the insulating layer 130 for stripping exposed by removing the first metal layer 141 may be removed (a region D may be removed) in the thickness direction. Here, the thickness direction is defined based on the thickness direction of the substrate.

Here, the first metal layer 141 exposed through the cavity 171 processing is removed by an etchant capable of etching a metal. In this case, since the insulating layer 130 for stripping is made of a material having close adhesion, the metal layer 141 and the insulating layer 130 for stripping that correspond to a region B of FIG. 8 are maintained in a state in which they are adhered to each other, thereby making it possible to prevent the etchant from penetrating into the inner layer pad in advance.

As shown in FIG. 8, the first metal layer 141 corresponding to the region B means the first metal layer 141 that is not exposed through the cavity 171 processing.

Figure 9:
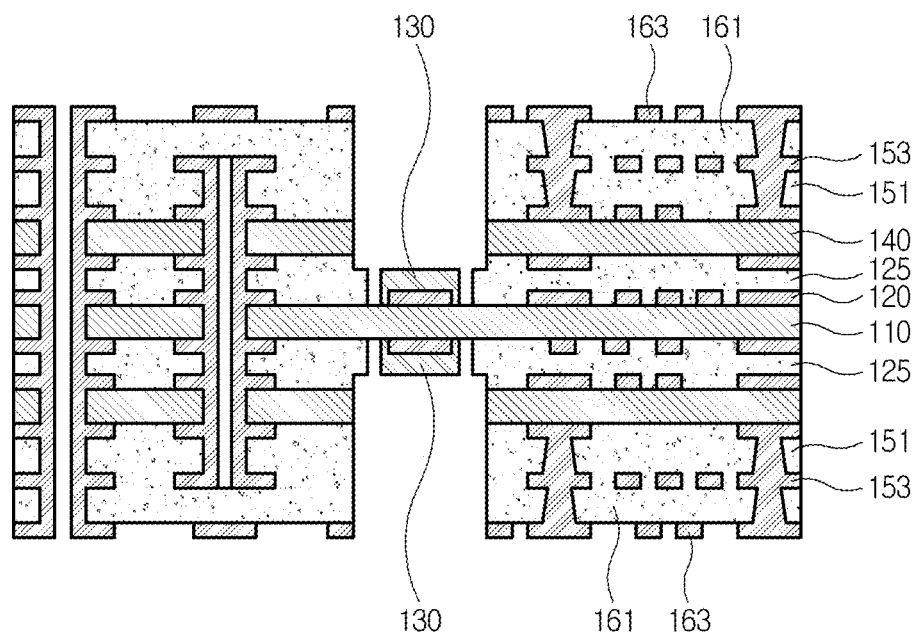

Next, as shown in FIGS. 8 and 9, the first metal layer 141 contacting the insulating layer 130 for stripping and the insulating layer 130 for stripping may be separated from each other.

More specifically, the first metal layer 141 and the insulating layer 130 for stripping are separated from each other, such that the region D of FIG. 8 is removed.

In this case, the insulating layer 130 for stripping and the first metal layer 141 may be separated from each other by a cutting tool such as a knife or by a separation process through handwork.

Figure 10:
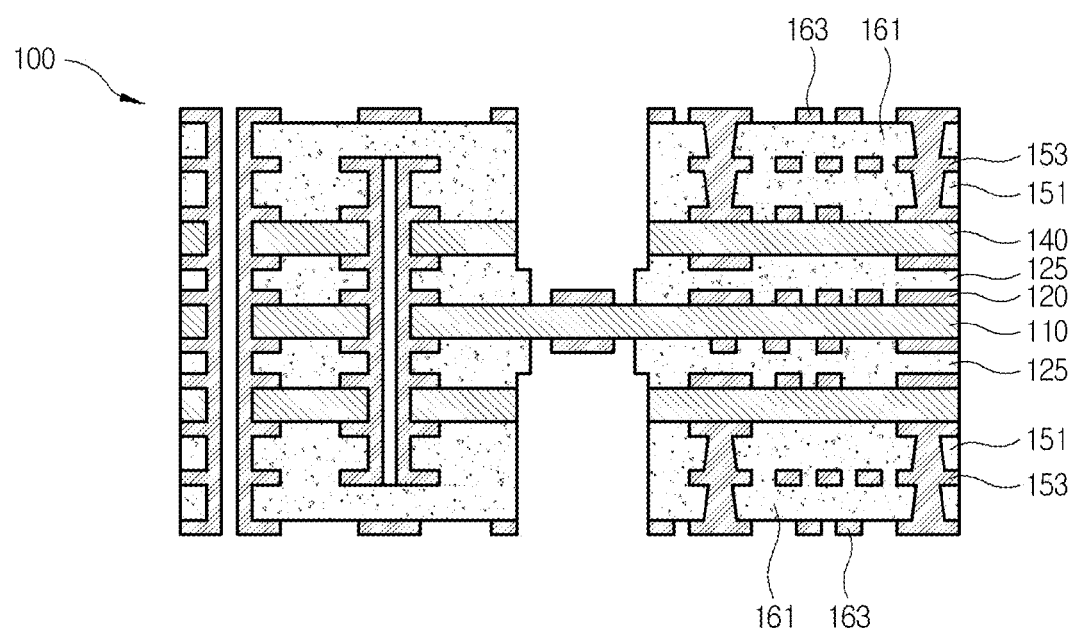

Next, as shown in FIG. 10, the insulating layer 130 for stripping may be removed.

In this case, the insulating layer 130 for stripping may be removed using a stripping solution of sodium hydroxide (NaOH), potassium hydroxide (KOH), or the like, capable of stripping an insulating material.

Meanwhile, as shown in FIG. 3, a second insulating layer 151 may be formed on the CCL layer 140.

In this case, the second insulating layer 151 may be made of a prepreg material, but is not limited thereto.

Next, as shown in FIG. 3, a second metal layer 153 may be formed on the second insulating layer 151.

Figure 4:
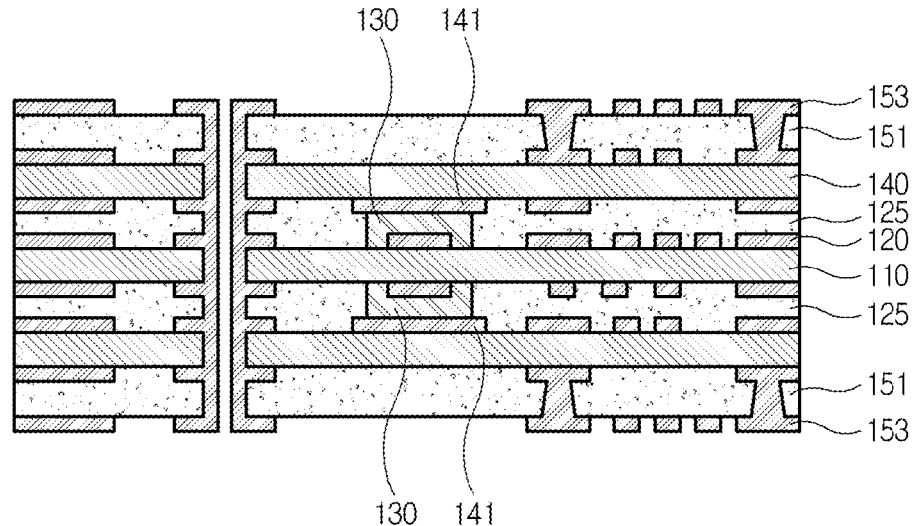
Figure 5:
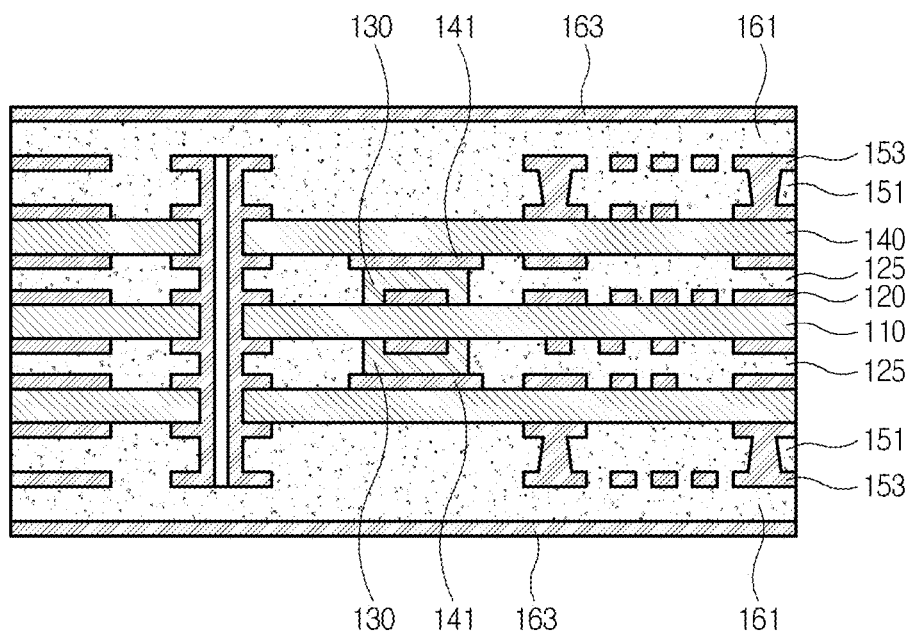
Figure 6:
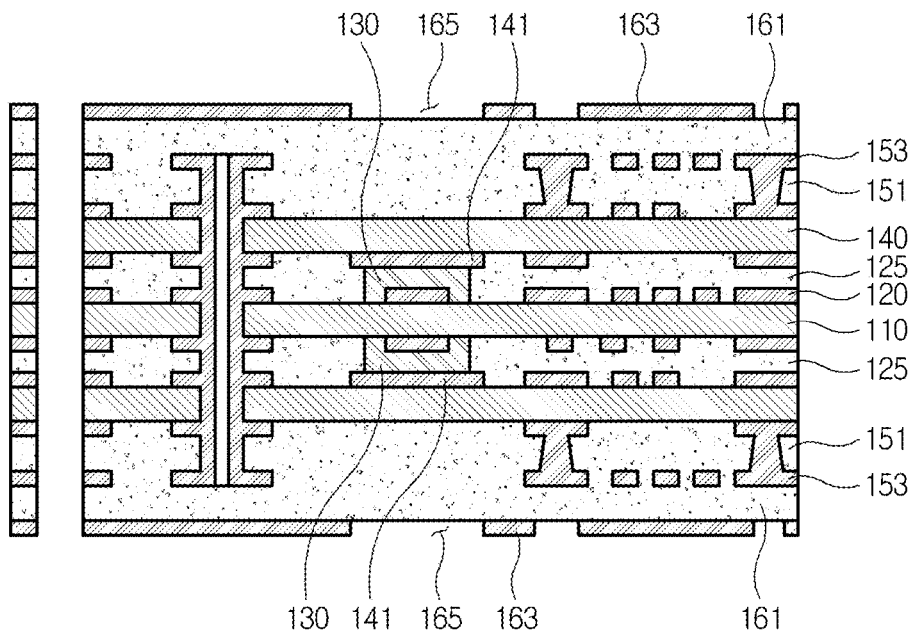

Then, as shown in FIGS. 4 to 6, a third insulating layer 161 and a third metal layer 163 may be formed. In addition, a multi-layer build-up layer may be formed.

Next, as shown in FIG. 3, the second metal layer 153 may be patterned.

In this case, a through-via penetrating through all layers of the printed circuit board as well as the base substrate may also be formed by a laser drilling process, a mechanical drilling process, a plating process, and the like, but is not limited thereto.

In addition, in the case in which the second metal layer 153 and the second insulating layer 151 are formed, the cavity 171 processing may be performed on the second metal layer 153, the second insulating layer 151, and the CCL layer 140 at the time of performing the above-mentioned cavity 171 processing.

That is, the cavity 171 processing is performed on the CCL layer 140, the second insulating layer 151, and the second metal layer 153 so that an edge region in the upper surface of the first metal layer 141 is exposed by performing laser processing on the CCL layer 140, the second insulating layer 151, and the second metal layer 153.

In this case, when the multi-layer build-up layer is additionally performed, the cavity 171 processing is also performed on the multi-layer build-up layer.

In addition, as shown in FIGS. 5 and 6, a window 165 for the cavity 171 processing may be formed in the third metal layer 163 corresponding to the outermost layer.

With the method for manufacturing a printed circuit board according to the preferred embodiments of the present invention, a protective film for stripping and a metal layer closely adhered to the protective film for stripping are formed on the inner layer pad to protect the inner layer pad at the time of laser processing related to the cavity processing and applying an etchant, thereby making it possible to improve reliability of a product.

In addition, according to the preferred embodiments of the present invention, the metal layer closely adhered to the protective film is used, thereby making it possible to prevent a problem that the etchant has an effect on the inner layer pad in advance.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A method for manufacturing a printed circuit board, the method comprising:
   preparing a base substrate having a circuit layer formed on one surface thereof or the other surface thereof; the circuit layer including an inner layer pad and a circuit pattern;
   forming an insulating layer for stripping on an outer surface of the inner layer pad in the circuit layer;
   forming a first insulating layer on the base substrate as well as the insulating layer for stripping and the circuit layer, the first insulating layer having an open part corresponding to the insulating layer for stripping;
   forming a copper clad laminate (CCL) layer on the first insulating layer so that a first metal layer for a stopper contacts an upper surface of the insulating layer for stripping exposed through the open part;
   performing cavity processing so that an edge region in an upper surface of the first metal layer is exposed by performing laser processing on the CCL layer;
   removing the exposed first metal layer in a thickness direction;
   removing the insulating layer for stripping exposed by removing the first metal layer in the thickness direction;
   separating the first metal layer contacting the insulating layer for stripping and the insulating layer for stripping from each other; and
   removing the insulating layer for stripping.

2. The method as set forth in claim 1, wherein a diameter of the first metal layer formed to contact the upper surface of the insulating layer for stripping is formed to be larger than that of the insulating layer for stripping, in a length direction of the substrate.

3. The method as set forth in claim 1, wherein in the forming of the first insulating layer, the first insulating layer is made of a no-flow prepreg material.

4. The method as set forth in claim 1, wherein in the forming of the first insulating layer, the first insulating layer is in a cured state.

5. The method as set forth in claim 1, further comprising, after the forming of the CCL layer and before the performing of the cavity processing, forming a second insulating layer on the CCL layer and forming a second metal layer on the second insulating layer.

6. The method as set forth in claim 5, further comprising, after the forming of the second metal layer, patterning the second metal layer.

7. The method as set forth in claim 5, wherein in the performing of the cavity processing, the cavity processing is performed on the second metal layer, the second insulating layer, and the CCL layer.

8. The method as set forth in claim 5, wherein in the forming of the second insulating layer, the second insulating layer is made of a prepreg material.

9. The method as set forth in claim 1, wherein in the removing of the insulating layer for stripping in the thickness direction, the insulating layer for stripping is removed using a stripping solution of sodium hydroxide (NaOH) or potassium hydroxide (KOH).

10. A method for manufacturing a printed circuit board, the method comprising:

preparing a base substrate having a circuit layer formed on one surface thereof or the other surface thereof, the circuit layer including an inner layer pad and a circuit pattern;

forming an insulating layer for stripping on an outer surface of the inner layer pad in the circuit layer;

forming a first insulating layer on the base substrate as well as the insulating layer for stripping and the circuit layer, the first insulating layer having an open part corresponding to the insulating layer for stripping;

forming a CCL layer on the first insulating layer so that a first metal layer for a stopper formed on the CCL layer contacts an upper surface of the insulating layer for stripping exposed through the open part;

forming a second insulating layer on the CCL layer;

forming a second metal layer on the second insulating layer;

performing cavity processing so that an edge region in an upper surface of the first metal layer is exposed by performing laser processing on the CCL layer, the second insulating layer, and the second metal layer;

removing the exposed first metal layer in a thickness direction;

removing the insulating layer for stripping exposed by removing the first metal layer in the thickness direction;

separating the first metal layer contacting the insulating layer for stripping and the insulating layer for stripping from each other; and removing the insulating layer for stripping, wherein, the first insulating layer is in a cured state.

11. The method as set forth in claim 10, wherein a diameter of the first metal layer formed to contact the upper surface of the insulating layer for stripping is formed to be larger than that of the insulating layer for stripping, in a length direction of the substrate.

12. The method as set forth in claim 10, wherein in the forming of the first insulating layer, the first insulating layer is made of a no-flow prepreg material.

13. The method as set forth in claim 10, wherein in the forming of the first insulating layer, the first insulating layer is in a cured state.

14. The method as set forth in claim 10, further comprising, after the forming of the second metal layer, patterning the second metal layer.

15. The method as set forth in claim 10, wherein in the forming of the second insulating layer, the second insulating layer is made of a prepreg material.

16. The method as set forth in claim 10, wherein in the removing of the insulating layer for stripping in the thickness direction, the insulating layer for stripping is removed using a stripping solution of sodium hydroxide (NaOH) or potassium hydroxide (KOH).

* * * * *